(12) United States Patent
Cowley et al.

(10) Patent No.: US 7,610,033 B2
(45) Date of Patent: Oct. 27, 2009

(54) RADIO FREQUENCY TUNER

(75) Inventors: Nicholas Paul Cowley, Wroughton (GB); Peter Coe, Swindon (GB)

(73) Assignee: Intel Corporation, Santa Clara, CA (US)

( * ) Notice: Subject to any disclaimer, the term of this patent is extended or adjusted under 35 U.S.C. 154(b) by 531 days.

(21) Appl. No.: 11/333,806

(22) Filed: Jan. 17, 2006

(65) Prior Publication Data

US 2006/0183447 A1 Aug. 17, 2006

(30) Foreign Application Priority Data

Jan. 17, 2005 (GB) .................................. 0500825.5

(51) Int. Cl.
*H04B 1/18* (2006.01)
(52) U.S. Cl. ...................................... 455/315; 455/318
(58) Field of Classification Search .............. 455/550.1, 455/552.1, 178.1, 178.2, 182.1, 182.2, 313, 455/314, 315, 318, 323
See application file for complete search history.

(56) References Cited

U.S. PATENT DOCUMENTS 5,280,639 A * 1/1994 Kubo ....................... 455/182.2

7,027,833 B1 * 4/2006 Goodman ................... 455/318

FOREIGN PATENT DOCUMENTS

GB 2284115 5/1995

OTHER PUBLICATIONS

British Search Report for Application No. GB0500825.5, dated Feb. 28, 2005.

* cited by examiner

*Primary Examiner*—Thanh C Le
(74) *Attorney, Agent, or Firm*—Blakely, Sokoloff, Taylor & Zafman LLP

(57) ABSTRACT

A radio frequency tuner is provided having inputs for receiving signals in common or overlapping frequency ranges from distribution networks. Each input is connected to a respective first converter, for example performing upconversion to a first intermediate frequency above the RF frequency ranges of the incoming signals. The first frequency changers are arranged to be active one at a time. The outputs of the first frequency changers are supplied to a second frequency changer which performs downconversion on the output signal of the active first converter to convert a selected channel from one of the distribution networks to a second intermediate frequency. Sufficient RF isolation may therefore be provided without requiring mechanical switching components such as RF relays.

20 Claims, 4 Drawing Sheets

RADIO FREQUENCY TUNER

BACKGROUND OF THE INVENTION

1. Field of the Invention

The present invention relates to a radio frequency tuner. Such a tuner may be used, for example, to receive and select signals from two or more radio frequency sources.

2. Description of the Related Art

FIG. 1 of the accompanying drawings illustrates a tuner for receiving signals from a cable transmission network and a terrestrial transmission network and for selecting a channel from either network for reception. Tuners of this type are known as "Plug and Play". Such a tuner is connected to two (or more) networks at the same time. Both networks contain channels within a frequency range which is typically from approximately 47 MHz to approximately 1100 MHz. It is also typical for the channel frequency allocation to be substantially identical between the networks such that the channels of one network occupy the same frequencies as the channels of the other network.

In the case of a cable distribution network, the received spectrum is generally heavily populated by channels and is controlled so as to deliver a power range of between −64 and −34 dBm to a consumer. In the case of a terrestrial distribution network, fewer channels are typically present. However, the channel power range is generally not as well controlled as in the case of a cable distribution network so that channel power may vary from the thermal noise floor to, for example, 0 dBm. In general, at least some of the channel frequency allocations occupied in one of the networks will also be occupied in the other of the networks and sufficient isolation must be provided in order to avoid a potentially interfering channel from one network appearing on a selected channel from the other network. In particular, sufficient isolation must be present to prevent interference with reception by the tuner and to prevent contamination of network signals distributed to other consumers.

As shown in FIG. 1, an enclosure 11, for example in the form of a Faraday cage or "tin box", has radio frequency inputs 12 and 13 for connection to different distribution networks containing channels with the same frequency allocations in the same frequency ranges. The inputs 12 and 13 are connected to respective inputs of a radio frequency (RF) relay 14, which is controlled so as to act as a single pole changeover electronic switch for selectively connecting either of the distribution networks to the input of a tuner 15. The tuner 15 may be of any suitable architecture for converting any selected input channel to a desired intermediate frequency and for supplying this to the tuner output 16.

The RF relay 14 is a relatively expensive component which has to be physically large in order to provide the physical separation which is necessary for the required isolation between the distribution networks connected to the inputs 12 and 13 and in order to provide sufficient isolation between the non-selected relay input and the relay output. Also, the presence of the relay 14 in the signal path to the input of the tuner 15 results in an insertion loss which degrades the noise figure achievable by the tuner 15.

Although a typical example of the relay 14 can achieve isolation of the order of 80 dB at lower frequencies within the frequency range of the distribution networks, the isolation reduces with increasing frequency and so results in a degradation in the carrier-to-noise performance. In practice, although the resulting performance at higher frequencies is not ideal, it can be made acceptable.

Another disadvantage of the relay 14 is that, because it is a mechanical component, it exhibits degradation with time caused by repeated switching. Such degradation may include, for example, an increase in insertion loss caused by the build-up of contact resistance. This effect results in a reduction in noise figure and a degradation in impedance matching. Further, because of increased levels of surface contaminants on the relay contacts, the intermodulation performance may become degraded with time as such contaminants can have semiconducting properties resulting in non-linear distortion generation. Such degrading effects may be further compounded by the temperature variations which are typically experienced in a "set top box" application of such a tuner.

A further disadvantage of the use of an RF relay is that devices of this type are generally only available as changeover or two-way switches and can therefore only switch between two distribution networks. If more than two distribution networks are present, then further such relays have to be provided. For example, as shown in FIG. 2 of the accompanying drawings, an additional relay 27 has to be provided in order to provide selection from among three distribution networks connected to respective inputs 22, 23 and 28. Apart from the additional cost and bulk of such further relays, some of the signals are subjected to the cumulative effects of having passed through several relays. For example, in the three input case illustrated in FIG. 2, signals from the inputs 22 and 23 have to pass through both relays 24 and 27 in order to reach the tuner 25.

SUMMARY OF THE INVENTION

According to the invention, there is provided a radio frequency tuner comprising: a plurality of inputs for receiving signals in a plurality of frequency ranges, at least two of which at least partially overlap; a plurality of first frequency changers arranged to be active one at a time, each of the first frequency changers being connected to a respective one of the inputs and being arranged, when active, to convert a selected channel to a first intermediate frequency outside all of the frequency ranges; and a second frequency changer arranged to convert the selected channel from the currently active first frequency changer to a second intermediate frequency.

The tuner may comprise a single second frequency changer.

The second intermediate frequency may be the same for all of the first frequency changers.

The second intermediate frequency may be below all of the frequency ranges. The second intermediate frequency may be zero or a near zero intermediate frequency.

The first intermediate frequency may be the same for all of the first frequency changers.

The first intermediate frequency may be above all of the frequency ranges.

The at least two frequency ranges may be the same.

The at least two frequency ranges may have the same channel frequency allocations where they overlap.

At least two of the first frequency changers may have a common phase locked loop.

At least two of the first frequency changers may have a common local oscillator.

The deactivated first frequency changer may be arranged to be depowered.

The tuner may comprise an electronic switch between the first frequency changers and the second frequency changer for selecting an output signal from the currently active first frequency changer.

The tuner may comprise a first intermediate frequency filter between the first frequency changers and the second frequency changer.

The tuner may comprise a first substrate carrying a first of the first frequency changers and the second frequency changer. The tuner may comprise a second substrate carrying a second of the first frequency changers.

It is thus possible to provide a tuner which can achieve acceptable isolation between signals from different distribution networks without requiring the presence of any RF relays. Thus, effects such as insertion loss and degradation of performance with time associated with such relays can be avoided. A relatively less expensive and more compact arrangement can be provided.

BRIEF DESCRIPTION OF THE DRAWINGS

Like reference numerals refer to like parts throughout the drawings.

DETAILED DESCRIPTION

Figure 1:
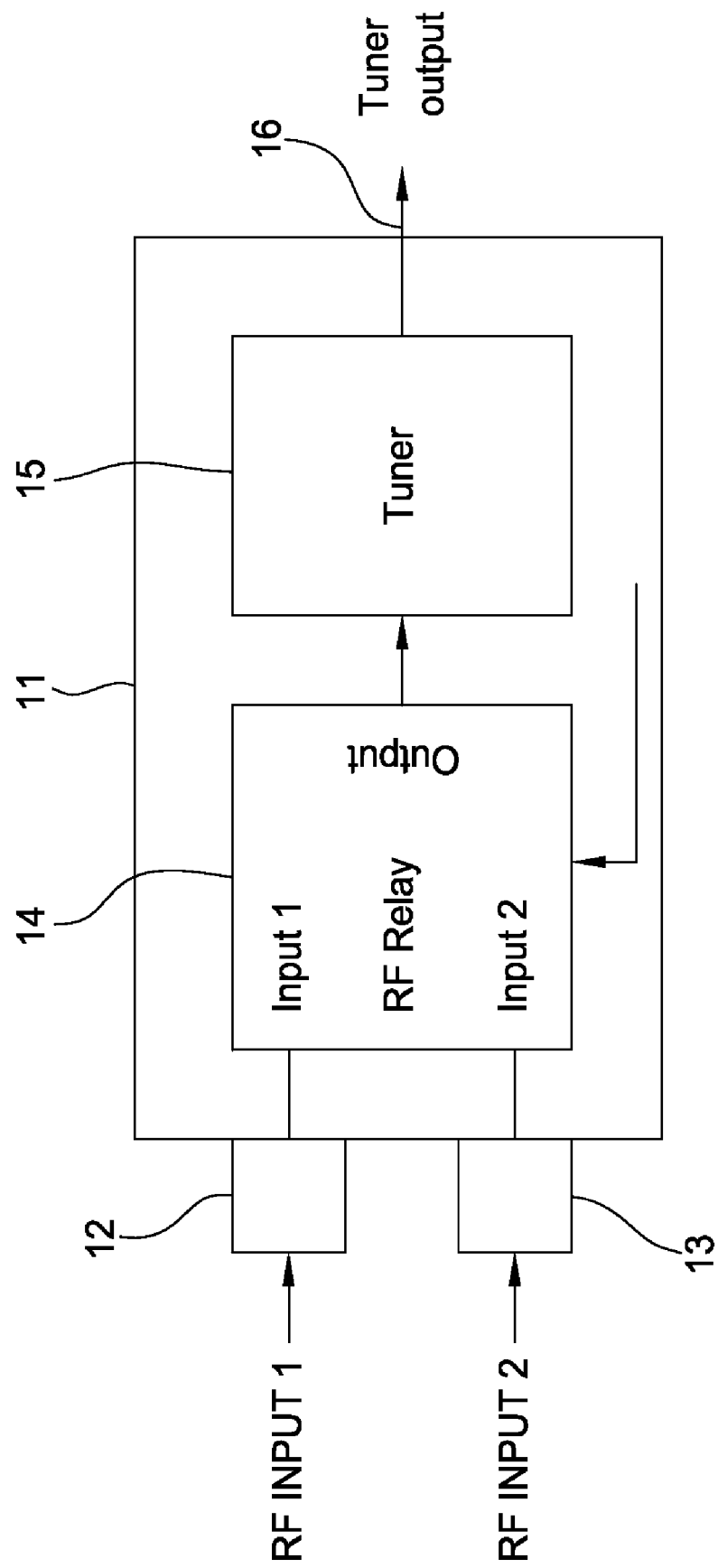
FIG. 1 (Prior Art) is a block schematic diagram of a known tuner.
Figure 2:
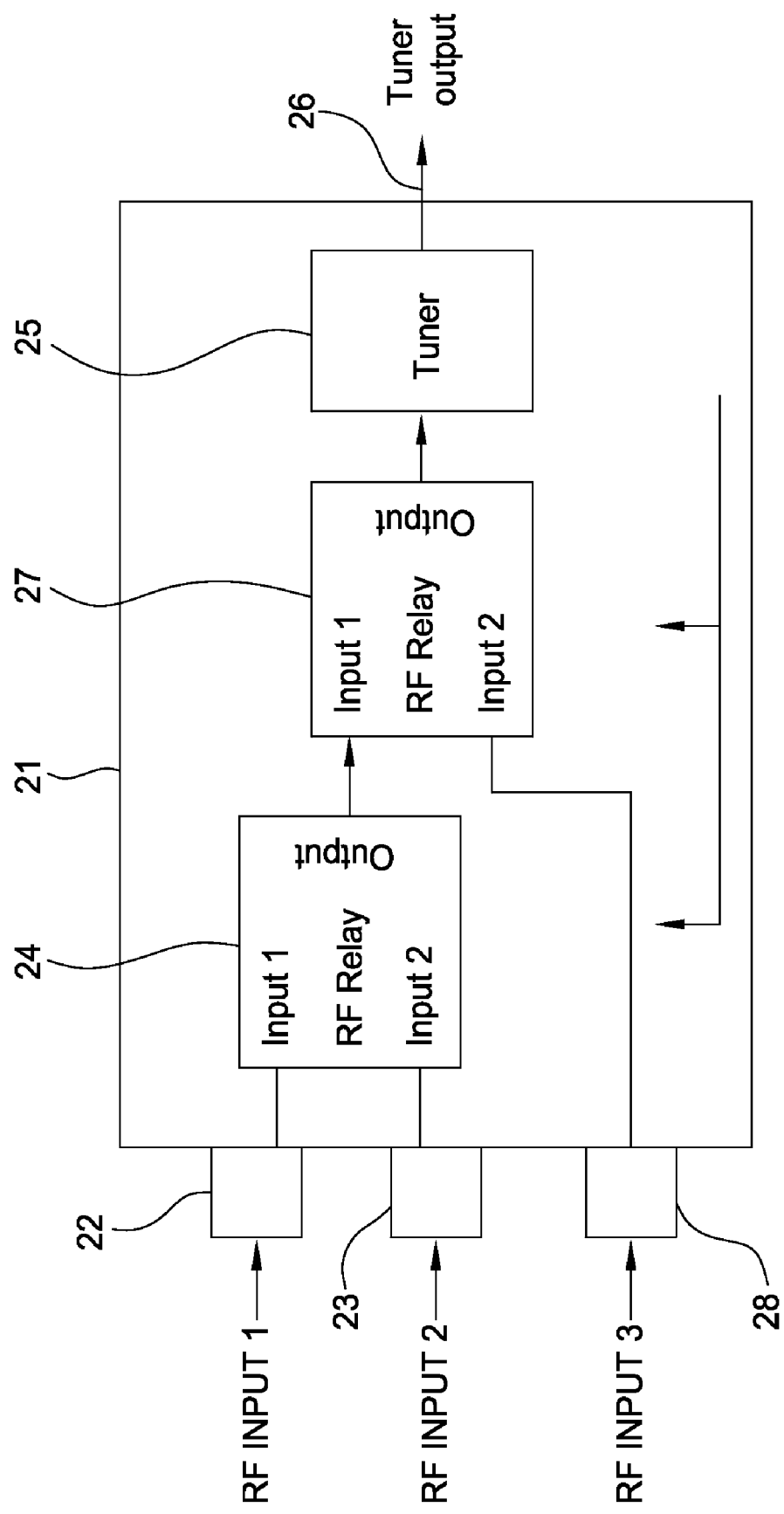
FIG. 2 (Prior Art) is a block schematic diagram of another known tuner.
Figure 3:
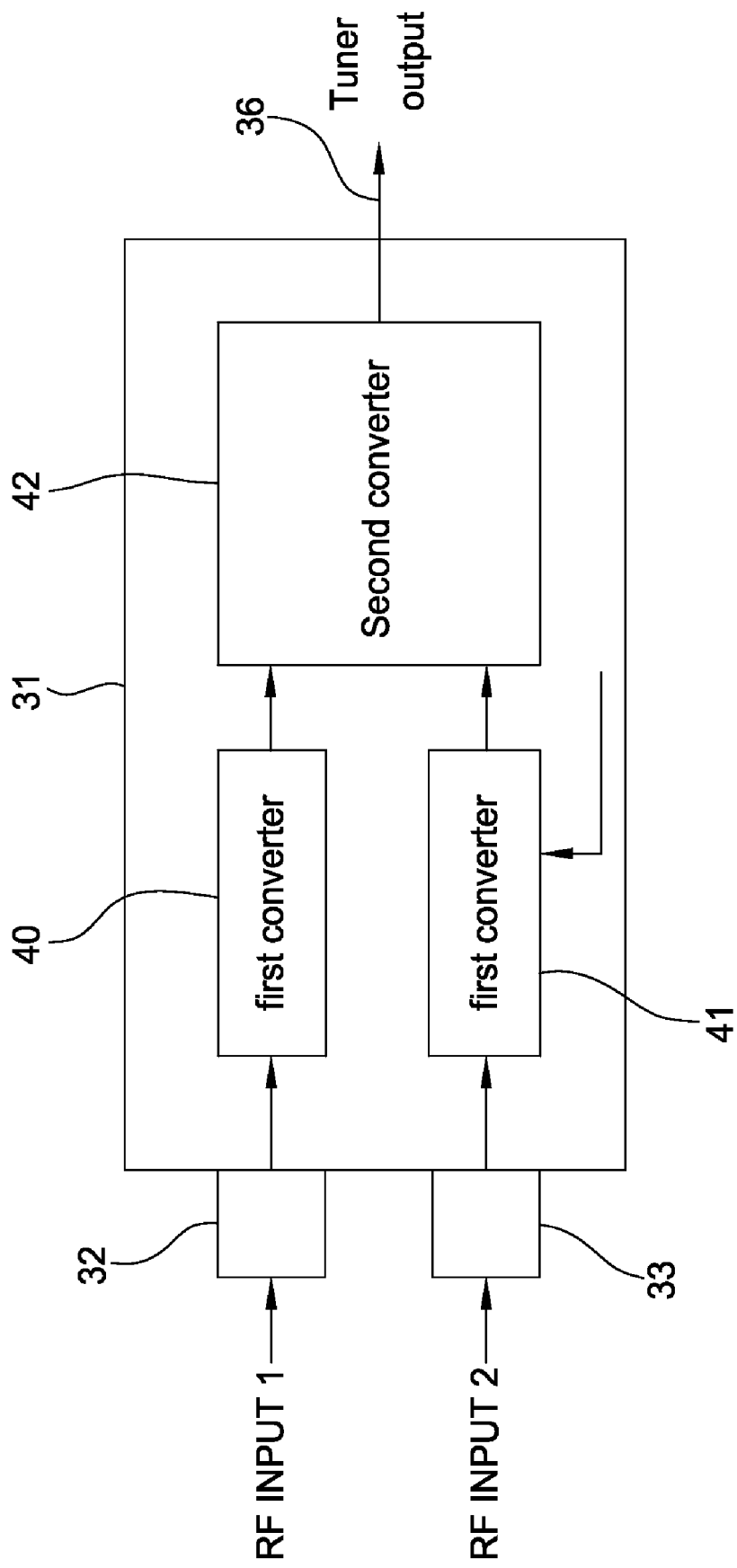
FIG. 3 is a block schematic diagram of a tuner constituting an embodiment of the invention.

The tuner shown in FIG. 3 comprises an enclosure 31, two radio frequency inputs 32 and 33, and a tuner output 36 as described hereinbefore with reference to FIG. 1. The tuner of FIG. 3 further comprises first frequency changers or converters 40 and 41 whose inputs are connected to the RF inputs 32 and 33, respectively. The outputs of the converters 40 and 41 are connected to respective inputs of a second frequency changer or converter 42, whose output is connected to the tuner output 36.

Although the tuner shown in FIG. 3 is intended for connection to two distribution networks, such a tuner may be arranged to receive signals from any number of distribution networks. In particular, each network requires an RF input connected to a respective frequency changer or converter, whose output is connected to a respective input of the single second converter 42.

Figure 4:
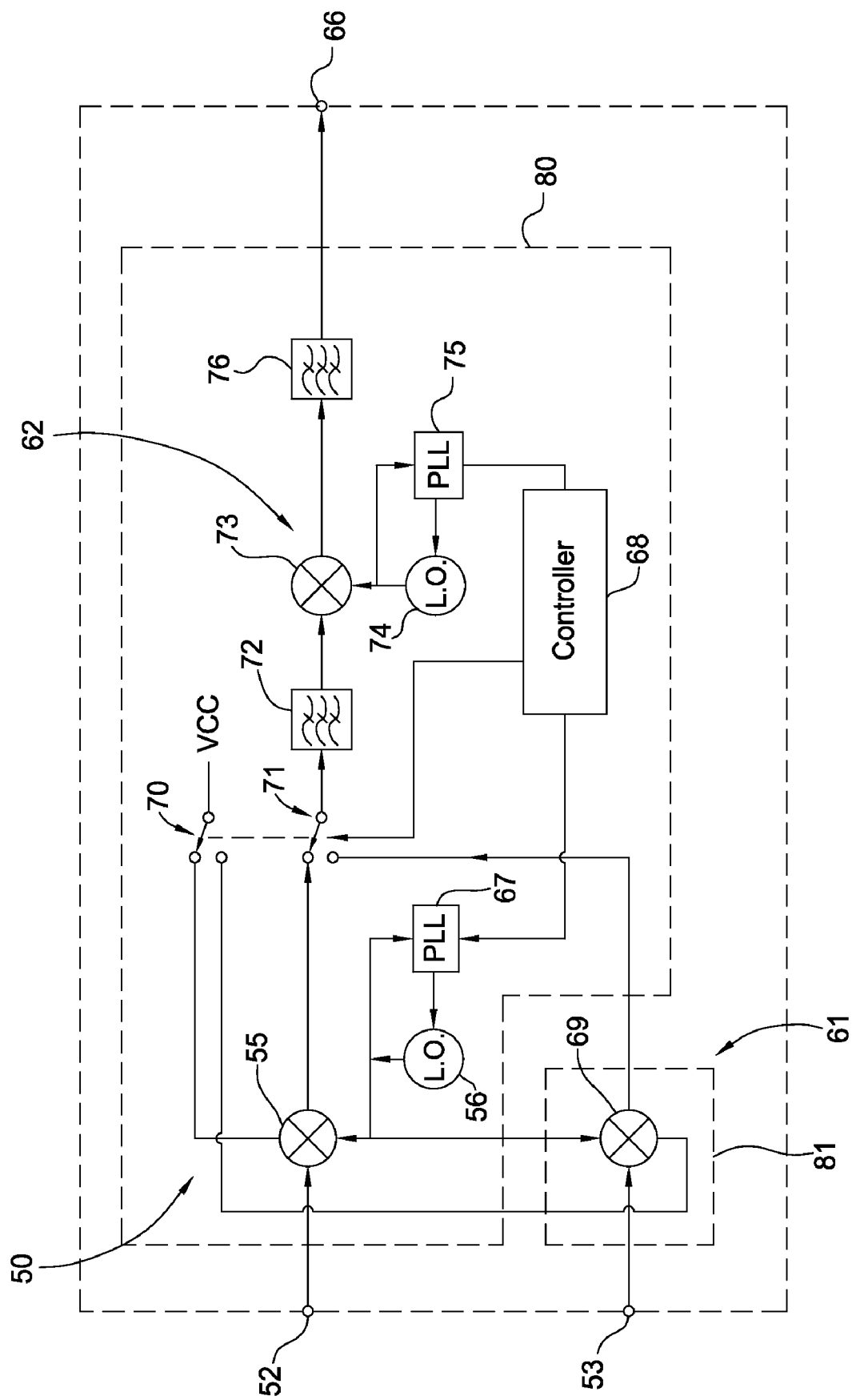
FIG. 4 is a block circuit diagram of the tuner of FIG. 3.

As illustrated in FIG. 4, the first frequency changer or converter 50 comprises a mixer or multiplier 55 having a first input connected to the RF input 52 and a second input connected to a local oscillator (LO) 56. The oscillator 56 is controlled by a phase locked loop (PLL) synthesiser 67, whose operation is controlled by a controller 68 embodied in any suitable way. The operation of a PLL synthesiser-controlled oscillator is well known and will not be described further.

Another first type of converter or frequency changer 61 also comprises a mixer 69 having a first input connected to the RF input 53. In this embodiment, the converters 50 and 61 share a common local oscillator and PLL synthesiser so that the output of the local oscillator 56 is connected to the second input of the mixer 69. However, in alternative embodiments, each converter may have its own local oscillator and/or PLL synthesiser.

The converters 50 and 61 are arranged to be active one at a time under control of the controller 68, which also controls tuning to select a desired channel for reception from either of the networks connected to the inputs 52 and 53. In this embodiment, the inactive mixer is depowered. Thus, an electronic switching arrangement 70 controlled by the controller 68 supplies power from a supply line Vcc to one of the mixers 55 and 69 at a time. The controller 68 simultaneously controls a switching arrangement 71 of the changeover type for selecting between the outputs of the mixers 55 and 69 so that the output of the active mixer is supplied to the input of a first high intermediate frequency filter 72 of bandpass type.

The output of the filter 72 is supplied to the first input of a mixer 73 forming part of the second converter 62. The second converter 62 further comprises a local oscillator 74, whose output is supplied to a second input of the mixer 73 and which is controlled by a PLL synthesiser 75 controlled by the controller 68. The output of the mixer 73 is supplied to a second intermediate frequency filter 76, whose output is connected to the tuner output 66.

The tuner is formed or carried on two substrates 80 and 81 housed within the enclosure 51. The substrates may be in the form of monolithic integrated circuits and either or both of the filters 72 and 76 may be formed on the substrate 80 or may be provided separately, for example on a printed circuit board carrying the substrates 80 and 81. In this embodiment, the substrate 81 carries only the mixer 69 of the converter 61 and all of the remaining components are formed on the substrate 80. In embodiments where the converter 61 has its own local oscillator and PLL synthesiser, then this may also be formed on the substrate 81. In embodiments required to be connected to more than two distribution networks, further substrates of the type shown at 81 and carrying a mixer and possibly a local oscillator and synthesiser may be provided between respective RF inputs and respective inputs on the substrate 80 with the electronic switching arrangements 70 and 71 having more than two ways.

The RF inputs 52 and 53 are connected to distribution networks, such as cable and terrestrial distribution networks, for supplying signals in the same frequency ranges and with the same channel frequency allocations. Such networks may supply digital and/or analogue television and/or radio and/or data channels, for example in the frequency range from approximately 47 MHz to approximately 1100 MHz. A channel selection and a network selection request is supplied to the controller 68, which then selects the appropriate converter to be active and controls the synthesiser 67 and/or the synthesiser 75 so as to tune to the selected channel frequency. Each of the converters 50 and 61 is an upconverter performing sum conversion to convert the selected channel to the first high intermediate frequency, which is above the frequency ranges of the signals supplied by the distribution networks. For example, the synthesiser 67 controls the local oscillator to perform high-side mixing to convert the channel to a nominal first intermediate frequency (IF) of approximately 1.2 GHz. The filter 72 has a bandpass characteristic nominally centred on the first IF and with a passband sufficiently wide to pass the selected channel and possibly one or more adjacent channels following conversion in the active converter.

The second converter 62 is a downconverter and performs difference conversion. In particular, the synthesiser 75 controls the local oscillator 74 so that the converter performs low-side mixing to convert the selected channel to the second IF. This may be a conventional IF, for example between approximately 30 MHz and approximately 50 MHz, and the filter 76 may be a bandpass filter having a passband centred on the second IF and with a bandwidth sufficient to pass substantially only the selected channel. Alternatively, the second converter 62 may be of the zero or near-zero IF type for converting the selected channel to baseband, in which case the filter 76 may be of lowpass type with a turnover or cutoff frequency appropriate for the channel being received. In other embodiments, the second converter may be of the image reject type or may comprise two mixers supplied by local oscillator signals in quadrature to give in-phase (I) and quadrature (Q) signals at baseband or with a frequency offset from baseband.

Although a dual conversion tuner has been illustrated, other embodiments may comprise more than two conversion stages.

During operation of the tuner, both distribution networks are permanently connected to the RF inputs 52 and 53. With one of the first converters 60 and 61 active for receiving a selected channel at its allocated RF frequency, the same channel will frequently be occupied in the other distribution network and will appear at the RF input. The inputs 52 and 53 and associated circuitry connected to the first converters are arranged physically so as to provide sufficient isolation between the distribution networks so as to prevent the potentially interfering channel from causing interference with the selected channel on the other network. In particular, the isolation is sufficient to prevent leakage of the undesired channel into the other distribution network and into the active converter.

The desired or selected channel is converted to the first IF by the active converter whereas the undesired or potentially interfering channel is not converted to the first IF because the mixer which receives it is inactive and, in the embodiment of FIG. 4, depowered. Any leakage of the undesired channel through the inactive converter to the input of the filter 72 or the mixer 73 is at the channel frequency whereas the desired channel has been converted to the first IF. Thus, following the first converters, the desired and undesired channels are at different frequencies and, provided the intermodulation performance of the second converter 62 is adequate, a potential interference mechanism is avoided. Further, leakage of the undesired channel backwards through the active converter is of such a low level that the distribution network supplying the desired channel substantially does not become contaminated by the undesired channel.

By placing the first IF above the frequency ranges of all of the distribution networks, a potential interference mechanism is substantially avoided. No special techniques are required in order to provide the necessary degree of isolation at RF within the tuner enclosure 51.

The individual first converters 50, 61 may be substantially identical with each other or may be optimised for the distribution networks to which they are to be connected. For example, the converter 50 may be connected via the input 52 to a cable distribution network with the mixer 55 being optimised for signal handling whereas the converter 61 may be connected via the input 53 to a terrestrial distribution network with the mixer 69 being optimised for noise figure. The performance of the tuner may therefore be improved. Adequate isolation may be achieved without requiring an expensive and large RF relay and the detrimental effects of such a relay on tuner performance can thus be avoided. Such a tuner is suitable for a high level of integration to allow a relatively compact arrangement to be provided in a small form factor and without mechanical aging effects.

What is claimed is:

1. A radio frequency tuner comprising:
    a plurality of inputs for receiving signals in a plurality of frequency ranges, each signal having a component associated with each of one or more channels within the frequency range, wherein at least two of the frequency ranges at least partially overlap;
    a plurality of first frequency changers configured to be active one at a time, wherein each of said first frequency changers, when active, converts a selected signal component associated with a desired channel of the one or more channels to a first intermediate frequency outside all of said frequency ranges to generate an intermediate signal; and
    a switch to select which of the plurality of first frequency changers are active by supplying power to an active frequency changer;
    a controller to simultaneously control the switch and select a desired channel for reception;
    a second frequency changer arranged to convert said intermediate signal to a second intermediate frequency outside all of said frequency ranges.

2. A tuner as claimed in claim 1, wherein said second frequency changer comprises a single second frequency changer.

3. A tuner as claimed in claim 1, wherein said second intermediate frequency is the same intermediate frequency for the intermediate signal generated by any of said first frequency changers.

4. A tuner as claimed in claim 1, wherein said second intermediate frequency is below all of said frequency ranges.

5. A tuner as claimed in claim 4, wherein said second intermediate frequency is one of a zero intermediate frequency and a near zero intermediate frequency.

6. A tuner as claimed in claim 1, wherein said first intermediate frequency is the same intermediate frequency for all of said first frequency changers.

7. A tuner as claimed in claim 1, wherein said first intermediate frequency is above all of said frequency ranges.

8. A tuner as claimed in claim 1, wherein said at least two of the frequency ranges are the same frequency range.

9. A tuner as claimed in claim 1, wherein said at least two of the frequency ranges have the same channel frequency allocation where said at least two of the frequency ranges at least partially overlap.

10. A tuner as claimed in claim 1, wherein said first frequency changers have a common phase locked loop.

11. A tuner as claimed in claim 1, wherein said first frequency changers have a common local oscillator.

12. A tuner as claimed in claim 1, wherein said first frequency changers are arranged to be depowered when deactivated.

13. A tuner as claimed in claim 1, wherein providing power to only the active frequency changer prevents undesired channels from one or more inactive frequency changers from being converted.

14. A tuner as claimed in claim 1, further comprising a first intermediate frequency filter between said first frequency changers and said second frequency changer.

15. A tuner as claimed in claim 1, further comprising a first substrate having said second frequency changer and a first of said first frequency changers disposed thereon.

16. A tuner as claimed in claim 15, further comprising a second substrate having a second of said first frequency changers disposed thereon.

17. A tuner as claimed in claim 1, wherein said first intermediate frequency is at or around 1.2 GHz.

18. A tuner as claimed in claim 1, wherein said second intermediate frequency is between 30 MHz and 50 MHz.

19. A radio frequency tuner comprising:
    a plurality of inputs for receiving signals in a plurality of frequency ranges, each signal having a component associated with each of one or more channels within the frequency range, wherein at least two of the frequency ranges at least partially overlap;

a plurality of upconverters configured to be active one at a time, wherein each of said upconverters, when active, converts a selected signal component associated with a desired channel of the one or more channels to a first intermediate frequency above all of said frequency ranges to generate an intermediate signal;

a switch to select which of the plurality of upconverters are active by supplying power to an active frequency upconverter;

a controller to simultaneously control the switch and select a desired channel for reception; and a downconverter arranged to convert said intermediate signal to a second intermediate frequency below all of said frequency ranges.

20. A method of radio frequency tuning, comprising:

receiving signals in a plurality of frequency ranges on a plurality of inputs, each signal having a component associated with each of one or more channels within the frequency range, wherein at least two of the frequency ranges at least partially overlap;

selecting one of a plurality of first frequency changers to be active, wherein each of said first frequency changers, when active, converts a selected signal component associated with a desired channel of the one or more channels to a first intermediate frequency outside all of said frequency ranges to generate an intermediate signal;

supplying power to one of the plurality of upconverters to select an active frequency upconverter; and converting said intermediate signal to a second intermediate frequency outside all of said frequency ranges.

* * * * *

UNITED STATES PATENT AND TRADEMARK OFFICE
CERTIFICATE OF CORRECTION

PATENT NO. : 7,610,033 B2 Page 1 of 1
APPLICATION NO. : 11/333806
DATED : October 27, 2009
INVENTOR(S) : Cowley et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 814 days.

Signed and Sealed this

Twelfth Day of October, 2010

David J. Kappos
*Director of the United States Patent and Trademark Office*